(12) United States Patent
Lee

(10) Patent No.: US 6,794,745 B1
(45) Date of Patent: Sep. 21, 2004

(54) LEAD ON CHIP TYPE SEMICONDUCTOR PACKAGE

(75) Inventor: Jong-Myoung Lee, Asan (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/710,606

(22) Filed: Nov. 10, 2000

(30) Foreign Application Priority Data

Nov. 10, 1999 (KR) ........................................ 1999-49675

(51) Int. Cl.[7] ......................... H01L 23/48; H01L 23/52; H01L 23/495
(52) U.S. Cl. ..................... 257/692; 257/666; 257/690; 257/691; 257/676; 257/669; 257/787; 257/696
(58) Field of Search ............................... 257/692, 666, 257/690, 691, 787, 676, 669, 696

(56) References Cited

U.S. PATENT DOCUMENTS

| | | | | |
|---|---|---|---|---|
| 5,235,207 A | * | 8/1993 | Ohi et al. | 257/670 |
| 5,428,247 A | | 6/1995 | Sohn et al. | 257/676 |
| 5,545,920 A | * | 8/1996 | Russell | 257/666 |
| 5,572,066 A | | 11/1996 | Safai et al. | 257/666 |
| 5,733,800 A | | 3/1998 | Moden | 437/220 |
| 5,821,606 A | | 10/1998 | Murakami et al. | 257/666 |
| 5,834,830 A | | 11/1998 | Cho | 257/667 |
| 5,977,614 A | * | 11/1999 | Takeuchi | 257/666 |
| 6,137,159 A | * | 10/2000 | Tsubosaki et al. | 257/777 |
| 6,268,643 B1 | * | 7/2001 | Russell | 257/666 |
| 6,297,545 B1 | * | 10/2001 | Sugiyama et al. | 257/666 |
| 6,392,295 B1 | * | 5/2002 | Iwaya et al. | 257/696 |

* cited by examiner

*Primary Examiner*—Eddie Lee
*Assistant Examiner*—Nitin Parekh
(74) *Attorney, Agent, or Firm*—Harness, Dickey & Pierce, P.L.C.

(57) ABSTRACT

An LOC type semiconductor package has a lead frame with leads divided into general leads and stable leads. The ends of the general leads are at the periphery of the semiconductor chip and separated from the semiconductor chip, such that the general leads do not come into contact with the semiconductor chip. The ends of the stable leads attach to a central portion of the surface of the semiconductor chip. Accordingly, since all the inner leads are not collectively arranged on the surface of the semiconductor chip but only the stable inner leads are located thereon, semiconductor chips in a variety of sizes can be mounted on the lead frame. Thus, there is no need for a new lead frame design whenever the semiconductor chip size is changed and a single lead frame design can be mass produced for use in several different products.

10 Claims, 4 Drawing Sheets

LEAD ON CHIP TYPE SEMICONDUCTOR PACKAGE

BACKGROUND OF THE INVENTION

1. Field of the Invention

The present invention relates to a lead on chip (LOC) type semiconductor package. More particularly, the present invention relates to an LOC type semiconductor package constructed in such a manner that a lead frame can accommodate mounting of a semiconductor chip having a size within a range of suitable sizes.

2. Description of the Related Art

Semiconductor chips such as DRAMs and SRAMs are becoming more highly integrated as memory capacities of electronic and information appliances become larger. Additionally, if feature sizes remain constant, the semiconductor chip size must be larger to accommodate greater capacity in a single chip. On the other hand, process improvements can reduce the required size of a semiconductor chip. The trend in semiconductor packaging is to decrease the sizes of completed semiconductor chip packages to make electronic and information appliances smaller and lighter. A conventional type of semiconductor package has a lead fame with a die pad for a semiconductor chip and leads surrounding the die pad. The die pad of the conventional type package has a size corresponding to a specific size of semiconductor chip and cannot accommodate larger semiconductor chips.

Another type of semiconductor chip package is the lead on chip (LOC) type, which does not include a die pad. Instead of attaching a semiconductor chip to a die pad, an adhesive tape directly attaches the semiconductor chip to leads of a lead frame. Accordingly, an LOC type semiconductor chip package has the leads on the surface of the semiconductor chip. Conventional LOC type semiconductor packages having a variety of structures are disclosed in: U.S. Pat. No. 5,428,247, entitled "Down-bonded lead on chip type semiconductor device"; U.S. Pat. No. 5,572,066, entitled "Lead on chip semiconductor device and method for its fabrication"; U.S. Pat. No. 5,733,800, entitled "Underfill coating for LOC package"; U.S. Pat. No. 5,821,606, entitled "LOC semiconductor package"; and U.S. Pat. No. 5,834,830, entitled "LOC package and fabricating method thereof", which are hereby incorporated by reference in their entirety.

In development of the conventional LOC type semiconductor package, the semiconductor chip is developed first and then the shape of the lead frame is designed according to the size of the semiconductor chip. For example, when a semiconductor chip is 5000 mm² in size, the shape of the lead frame corresponds to this size. In case of a semiconductor chip having a size of 4000 mm², the shape of the lead frame is according to the size, 4000 mm². However, a lead frame fabricated through the above procedure can accommodate semiconductor chip fitting thereto but cannot mount semiconductor chips having different sizes. For instance, a lead frame designed for a 5000 mm² semiconductor chip typically cannot accommodate smaller (e.g., 4000 mm²) semiconductor chips, for example, because a smaller semiconductor chip does not provide the full area needed for attaching the leads to the chip.

Accordingly, a process or design change that changes the size of the semiconductor chip typically requires a new design for the lead frame of the conventional LOC type package. This decreases production efficiency. Methods and structures that permits use of the same lead frame design for different sizes of semiconductor chips are sought.

SUMMARY OF THE INVENTION

In accordance with an embodiment of the present invention, an LOC type semiconductor package has leads of a lead frame shaped to accommodate semiconductor chips of different sizes and bond pad arrangements such as conventional single row and double row configurations. Accordingly, a change in semiconductor chip design that changes the size of a semiconductor chip does not require a new design for the lead frame. Accordingly, process changes or chip redesign are more efficient because less redesigning of the LOC package is required. Additionally, the same lead frame design can be used in different products that have different chip sizes, and the efficiency of mass production and reduced numbers of parts stocked for lead frames reduces the manufacturing costs of the products.

In one embodiment of the present invention, the leads of a lead frame include general leads and stable leads that are distinguished according to their roles. The general leads include general inner leads and general outer leads. The general inner leads are sealed in a molding resin but separated from a semiconductor chip, and the general outer leads extend out of the molding resin for electrical connections to external circuitry. The stable leads include stable inner leads and stable outer leads. The stable inner leads are sealed in the molding resin, and stable outer leads outwardly extended from the molding resin.

The ends of the general leads are at the periphery of the semiconductor chip and separated from the semiconductor chip, such that they do not come into contact with the semiconductor chip. Wires electrically connect the general leads to corresponding bonding pads of the semiconductor chip, so that the general inner leads serve as signal exchange paths. The ends of the stable leads are on the surface of the semiconductor chip, and wires electrically connect the stable leads to respective bonding pads on the semiconductor chip. The stable inner leads not only serve as signal exchange paths, but also press or attach to the semiconductor chip to fix the position of the semiconductor chip.

According to the present invention, only the stable inner leads are on the surface of the semiconductor chip, and semiconductor chips in a variety of sizes can be flexibly mounted on the lead frame. To achieve this flexibility, the stable inner leads extend to contact areas well within the boundaries of a semiconductor chip so that the area of a smaller semiconductor chip will still contain the contact areas. Thus, a new lead frame design is not required whenever the semiconductor chip size is changed. In addition, the present invention can maximize the flexibility of the lead frame to meet the mass-production system of "a small number of kinds but mass production".

BRIEF DESCRIPTION OF THE DRAWINGS

The features and advantages of the present invention will become more apparent by describing in detail embodiments thereof with reference to the attached drawings in which.

DETAILED DESCRIPTION OF THE PREFERRED EMBODIMENT

Figure 1:
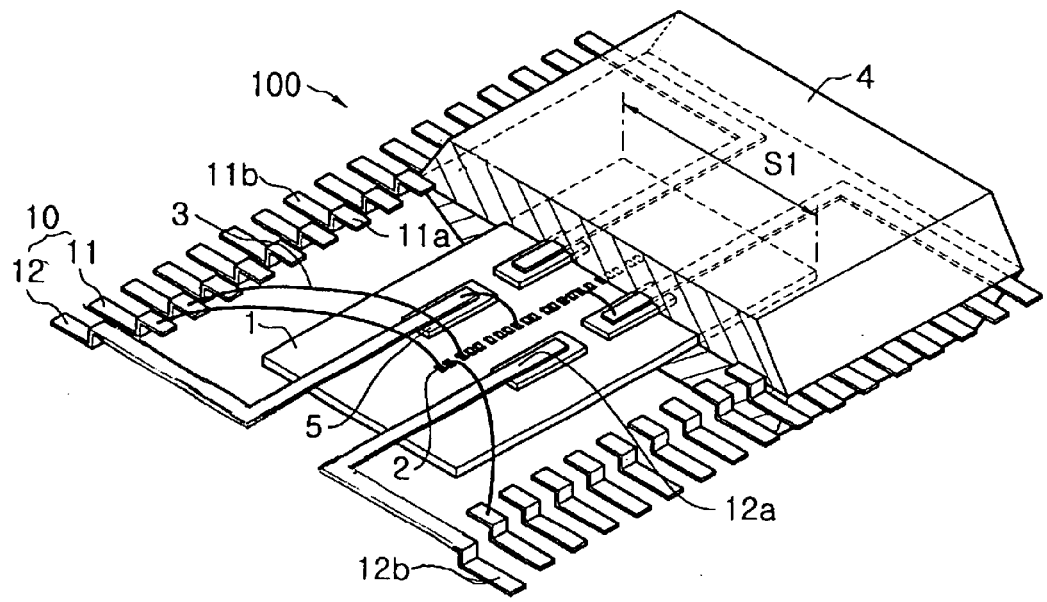
FIGS. 1 and 2 illustrate an LOC type semiconductor package in accordance with an embodiment of the present invention.

FIG. 1 shows an LOC type semiconductor package 100 according to an embodiment of the invention for a semiconductor chip 1. Semiconductor chip 1 has a plurality of bonding pads 2 arranged in a row and spaced at a predetermined interval on the surface of semiconductor chip 1. In the illustrated embodiment, bonding pads 2 are arranged along a center line of the surface of the semiconductor chip 1, but alternative embodiments can employ semiconductor chips having other configurations for the bonding pads. The bonding pads 2 receive and transmit electric input and output signals as required for the operation of the semiconductor chip 1. A plurality of leads 10 electrically connect to the bonding pads 2 via wires 3. More specifically, leads 10 include two groups respectively located at opposite edges of the semiconductor chip with the bonding pads 2 therebetween. Wires 3 electrically connect the bonding pads 2 to the corresponding leads 10. External circuit patterns (not shown) send electrical signals to and receive electrical signals from the semiconductor chip 1 via the bonding pads 2, the wires 3, and leads 10. After being connected, the bonding pads 2, inner portions of leads 10, wires 3 and semiconductor chip 1 are encapsulated by a molding resin 4 that protects enclosed structure from external shocks but leaves outer portions of lead 10 accessible for electrical connections.

As shown in FIG. 1, the leads 10 of the invention are divided into general leads 11 and stable leads 12 according to their roles. Each stable lead 12 extends from an end of the LOC package 100, in a direction perpendicular to the row of bonding pads 2 to a bend and extends from the bend, parallel to the row of bonding pads 2 to a contact area on the semiconductor chip 1. On each side of semiconductor chip 1, the general leads 11 are arranged in a row between the outer portions of the stable leads 12. The general leads 11 include general inner leads 11a, which are the portions of leads 11 closest to the semiconductor chip 1, and general outer leads 11b, which are the portions of leads 11 furthest from the semiconductor chip 1. Similarly, the stable leads 12 also have stable inner leads 12a closest to (e.g., contacting) the semiconductor chip 1 and stable outer leads 12b furthest from the semiconductor chip 1. In the package 100, the molding resin 4 covers the general inner leads 11a, and the general outer leads 11b extend out from the molding resin 4. Similarly, the molding resin 4 covers the stable inner leads 12a, and the stable outer leads 12b extend out from the molding resin 4.

In this LOC type semiconductor package 100, the ends of the general inner leads 11a are separated from the semiconductor chip 1 such that they do not come into contact with the semiconductor chip 1. In contrast, the ends of the stable inner leads 12a contact the surface of the semiconductor chip 1. An adhesive member 5, for example, an adhesive tape, is on each portion of the surface of the semiconductor chip 1 that the stable inner leads 12a contact. The adhesive members 5 securely attach the ends of the stable inner leads 12a to the surface of the semiconductor chip 1. With the help of the adhesive members 5, the stable inner leads 12a can remain firmly affixed to the surface of the semiconductor chip 1 for a long period of time.

The general leads 11 serve as signal exchange paths while electrically connected to the bonding pads 2 of the semiconductor chip 1 through the wires 3. The stable leads 12 not only serve as signal exchange paths while being electrically connected to the bonding pads 2 of the semiconductor chip 1 through the wires 3 but also contact and fix the position of the semiconductor chip 1 relative to leads 10.

This structure of the leads 10 differs significantly from that of the leads constructing the conventional LOC type semiconductor package. In case of the conventional LOC type semiconductor package, as described above, the shapes of the leads depend on the size of the semiconductor chip, and all of the leads are arranged to contact the surface of the semiconductor chip. Accordingly, length and position of the leads must extend to the area of the semiconductor chip, where the leads attach to the semiconductor chip. A semiconductor chip that is too small will lack the area necessary to contact all of the leads. As a result, the convention lead frame of an LOC package can mount only the semiconductor chip having the size fitting the lead frame. In case of the LOC type semiconductor package of the invention, however, only the stable leads 12 contact and attach to the semiconductor chip 1, and the stable leads can have a shape such that a wide variety of different size chips can contact the stable leads 12. In particular, the stable leads 12 can extend to a central portion of a relatively large semiconductor chip so that the stable leads can still contact a smaller semiconductor chip. The lead frame thus has the flexibly to mount semiconductor chips in various sizes.

Figure 2:
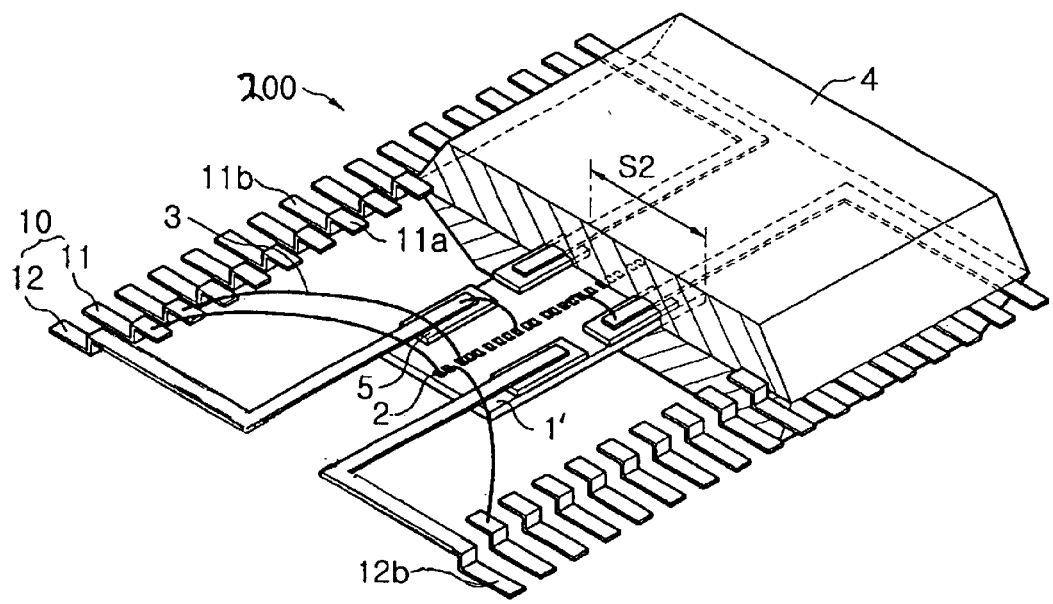

FIGS. 1 and 2 illustrate packages 100 and 200 that contain semiconductor chips 1 and 1' that differ in size. In particular, semiconductor chip 1 has a size S1, for example, 5000 mm$^2$, and semiconductor chip 1' has a size S2, for example, 4000 mm$^2$, that is smaller than the size S1. Despite the difference in size, packages 100 and 200 use the same lead structures. Accordingly, the leads 10 can mount not only the semiconductor chip 1 having a size S1, for example, 5000 mm$^2$, as shown in FIG. 1 but also the semiconductor chip 1' having a size S2, for example, 4000 mm$^2$ or 3000 mm$^2$, as shown in FIG. 2. According to the present invention, a new lead frame design is not required whenever the size of the semiconductor chip 1 is changed, for example, when process improvements reduce the size of an existing semiconductor chip design. Furthermore, the lead frame has the flexibility to be used in different products that employ semiconductor chips of different sizes. Thus, mass-production of lead frames can reduce the cost of the lead frames an each of the products that uses the same lead frame.

One feature that allows this flexibility of this lead structure is that the stable leads 12 extend to contact area near the center of semiconductor chip 1. Accordingly, when semiconductor chip 1 is replace with the smaller semiconductor chip 1', the stable leads can still contact and attach to the smaller semiconductor chip 1'. Additionally, general leads 11, which can be in groups distributed along the entire lengths of the edges of semiconductor chip 1, do not contact the semiconductor chip 1 or 1'. In prior LOC packages where such leads contacted a semiconductor chip, the semiconductor chip could not be replaced with a smaller chip because one or more of the lead would fail to contact the smaller chip. LOC package 200 does not have that problem because general leads 11 are not designed to contact the semiconductor chip 1 or 1'.

As shown in FIGS. 1 and 2, the ends of the general leads 11 and the stable leads 12 can be bent toward the top of the semiconductor chip 1 to construct an "up-set structure". Generally, the semiconductor chip 1 or 1' is best protected when near the center of molding resin 4. Accordingly, the stable leads 12, which contact the top of semiconductor chip 1 or 1', typically require an up-set structure so that the stable outer leads 12b are at an appropriate level for the external electrical connections. The general leads 11 do not require the up-set structure since the general leads do not contact the upper surface of the semiconductor chip 1 or 1'. However, the height difference between the bonding pads 2 and the general inner leads 11a facilitates formation of a smooth looping structure when a production line connects wires 3 between the bonding pads 2 and the ends of the general inner leads 11a. The adhesive member 5 attach the ends of the stable inner leads 12a to the surface of the semiconductor chip 1 or 1' resulting in a predetermined height difference between the stable inner leads 12a and the bonding pads 2. The set-up structure of the stable leads 12 is optional because the looping structure of the wires 3 coupled to the ends of the stable inner leads 12a can be easily attained without constructing a separate up-set structure.

When the ends of the general inner leads 11a are bent toward the top of the semiconductor chip 1, the ends of the general inner leads 11a and those of the stable inner leads 12a can be on the same plane in the production line. Conventional wire bonding tools in a production line work best to smoothly form the loop structure from wires, for example, capillaries, if the ends of the general inner leads 11a and stable inner leads 12a are in one plane.

Figure 3:
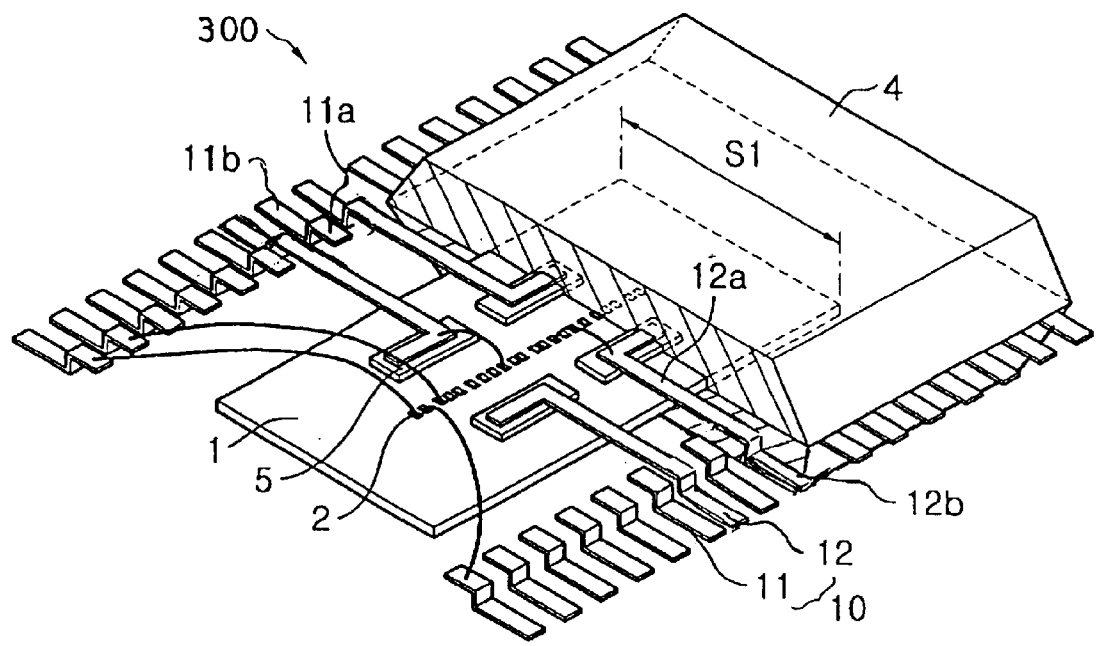
FIGS. 3 and 4 illustrate an LOC type semiconductor package in accordance with another embodiment of the present invention.

In accordance with another embodiment of the invention, as shown in FIG. 3, the stable outer leads 12b can be between neighboring general outer leads 11b. For example, stable outer leads 12b are in the middle of the general outer leads 11b in FIG. 3. In this case, the ends of the stable inner leads 12a are bent toward the periphery of the semiconductor chip 1. In this configuration, the stable leads 12 extend from the periphery of package 300, in a direction perpendicular to the row of bonding pads 2, to central contact areas on the semiconductor chip. Stable inner leads 12a further extend parallel to the row of bonding pads 2 toward the periphery of the semiconductor chip 1. As a result, the areas of the stable leads 12 for supporting the semiconductor chip 1 are considerably enlarged, to thereby fix the semiconductor chip 1 more securely.

As in the previous embodiment, the ends of the general inner leads 11a are separated from the semiconductor chip 1, and the ends of the stable inner leads 12a are on the surface of the semiconductor chip 1. The adhesive members 5 attach the stable inner leads 12a to the portions of the surface of the semiconductor chip 1 that correspond to the ends of stable inner leads 12a. Since only the stable leads 12 are on the surface of the semiconductor chip 1, semiconductor chips in various sizes can be mounted on the lead frame.

Figure 4:
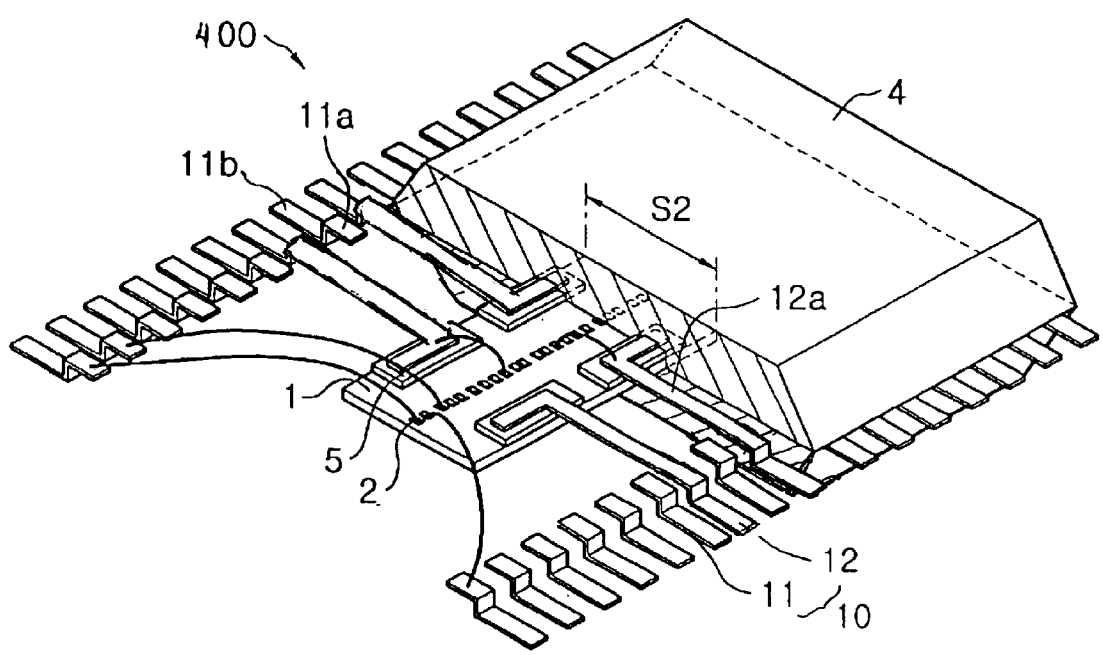

FIGS. 3 and 4 illustrate that the mounting of semiconductor chips 1 and 1' having different sizes S1 and S2 on the leads 10 having the same design. In this case, the leads 10 can mount not only the semiconductor chip 1 having a size S1, for example, 5000 mm$^2$, as shown in FIG. 3 but also the semiconductor chip 1' having a size S2, for example, 4000 mm$^2$ or 3000 mm$^2$, as shown in FIG. 4. Accordingly, a new lead frame design is not required whenever the size of the semiconductor chip changes. Furthermore, the same lead frame can be the mass-produced for use in several different products, which increases production efficiency.

Figure 5:
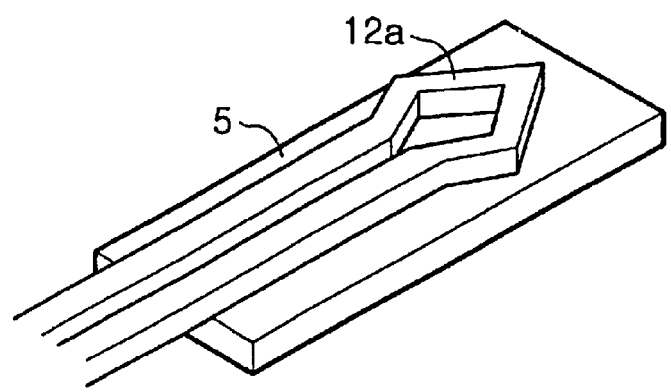
FIGS. 5, 6, and 7 illustrate different shapes for the end of a stable lead in an LOC type semiconductor package in accordance with another embodiment of the present invention.
Figure 6:
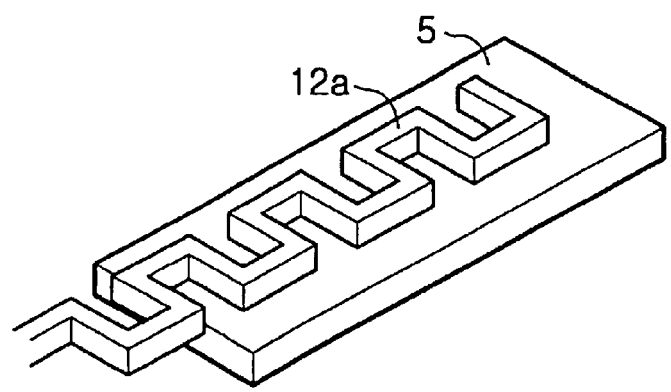
Figure 7:
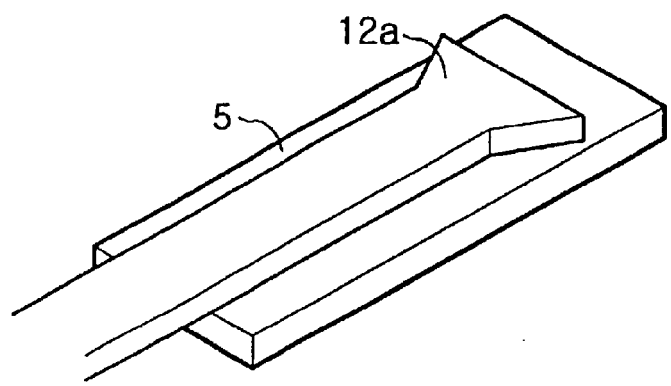
Figure 8:
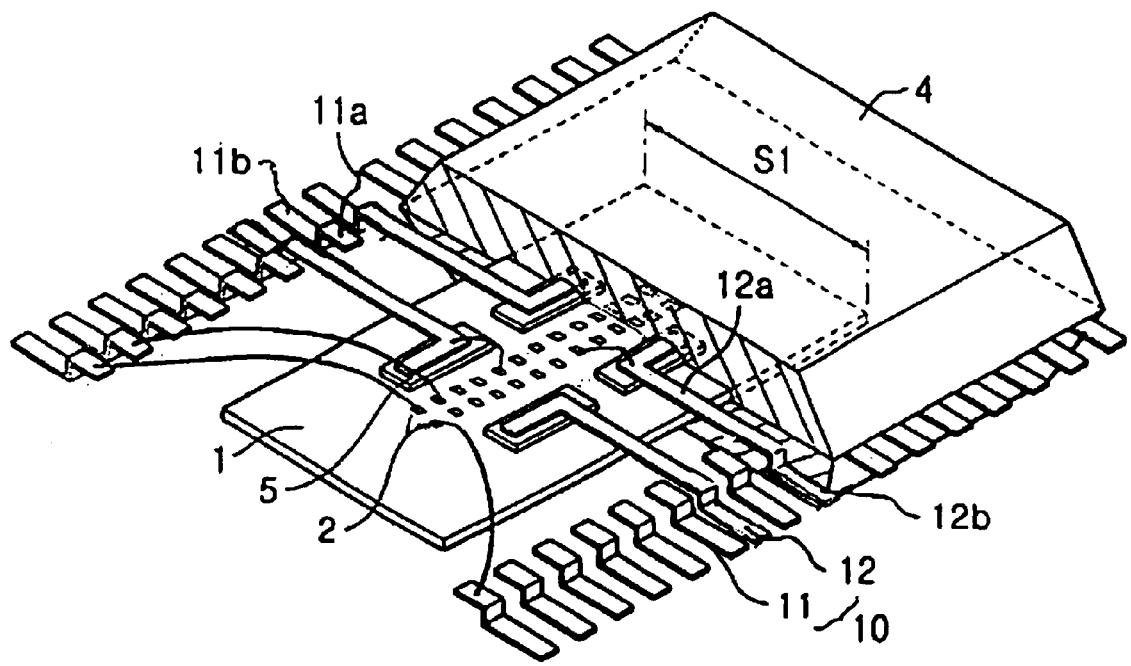
FIG. 8 illustrates an LOC type semiconductor package in accordance with an embodiment of the invention incorporating a semiconductor chip having a conventional double row bond pad arrangement.

FIGS. 5, 6, and 7 show stable leads 12 with ends shaped to increase the surface area that contacts with the adhesive member 5 to improve the stability of the semiconductor chip inside an LOC package. As an example, the end of the stable inner lead 12a has an arrow shape divided into two parts, as shown in FIG. 5, to increase the surface area thereof. In this embodiment, wider areas of the stable leads 12 supports the semiconductor chip 1 more securely such that the stable leads hold the semiconductor chip 1 with more strength. Thus, the stable leads 12 can securely fix the semiconductor chip 1. FIG. 6 shows another example of a shape of the end of the stable inner lead 12a. Referring to FIG. 6, the end of each stable inner lead 12a is bent right and left n times, for example, thirteen times, to construct a zigzag shape, thereby increasing the surface area thereof. FIG. 7 shows an end of the stable inner lead 12a that is enlarged right and left to form a spatula shape, resulting in an increase in the entire surface area thereof. In these cases, wider area of the stable lead 12 supporting the semiconductor chip 1 can be secured to allow the stable lead 12 to better hold the semiconductor chip 1, fixing the semiconductor chip 1 more securely.

Conventional fabrication techniques and materials can be used in the lead frame for LOC packages 100 and 200 of FIGS. 1 and 2 and the lead frame for the LOC packages 300 and 400 of FIGS. 3 and 4. For example, the lead frame including general leads 11 and stable leads 12 can be a patterned metal layer on an adhesive tape having openings that permit connection of wires 3 between the leads 10 and the bonding pads 2. The LOC type semiconductor package 100, 200, 300, or 400 can be put in an electronic appliance being mounted on an external circuit block, for example, a printed circuit board, to serve as an essential element of the electronic appliance.

As described above, the present invention modified the shapes of the leads to flexibly cope with variations in semiconductor chip size and bond pad arrangement. By doing so, semiconductor chips in various sizes or utilizing different bond pad arrangements can be mounted on the same leads. The present invention can be applied to a variety of kinds of LOC type semiconductor packages including for example, multi-chip LOC type semiconductor packages as well as the above-described LOC type semiconductor package, which includes a single chip.

According to the present invention, the leads of the lead frame in the LOC type semiconductor package include general leads and stable leads having different roles. The general leads include general inner leads contained within a molding resin, and general outer leads extending from the molding resin. The stable leads have stable inner leads contained within the molding resin, and stable outer leads extending from the molding resin. The ends of the general leads are at the periphery of the semiconductor chip and separated from the semiconductor chip, such that they do not contact with the semiconductor chip, but the ends of the stable leads contact the surface of the semiconductor chip. In this case, the general inner leads serve as signal exchange paths while being electrically connected to bonding pads of the semiconductor chip via wires. The stable inner leads not only serve as signal exchange paths, being electrically connected to the bonding pads of the semiconductor chip through the wires, but also attach to the semiconductor chip to physically fix the semiconductor chip for packaging.

In the present invention, the stable leads have portions that extend to and contact a central region of a chip. Accordingly, the stable leads can contact and attach to large or small semiconductor chips. Since of all the inner leads are not collectively arranged on the surface of the semiconductor chip but only the stable inner leads are located thereon, semiconductor chips in a variety of sizes can be flexibly mounted on the lead frame. Thus, there is no need to design a new lead frame whenever the semiconductor chip size changes.

While certain embodiments and details have been shown for the purpose of illustrating the present invention, it will be apparent to those skilled in the art that various changes and modifications may be made herein without departing from the spirit or scope of the invention.

What is claimed is:

1. A LOC type semiconductor package, comprising:
a semiconductor chip having a chip periphery and a plurality of bonding pads, the bonding pads being arranged within the chip periphery;
a plurality of general leads, the general leads having inner and outer portions, the inner portions being spaced from and not crossing the chip periphery;
a first plurality of wires extending between corresponding bond pads and inner portions of the general leads, thereby extending across the chip periphery;
as many as four stable leads, the stable leads having inner and outer portions, the inner portions extending over the chip periphery and arranged in a generally planar relationship with the inner portions of the general leads;
an adhesive composition arranged between the semiconductor chip and an attachment section of the inner portion of each stable lead;
a second plurality of wires within the chip periphery extending between corresponding bond pads and inner portions of the stable leads; and
a molding resin encapsulating the semiconductor chip, the inner portions of the general leads, the inner portions of the stable leads, the adhesive composition, the first plurality of wires and the second plurality of wires.

2. A LOC type semiconductor package according to claim 1, wherein:
the outer portions of the general leads extend from the molding resin; and
the outer portions of the stable leads extend from the molding resin.

3. A LOC type semiconductor package according to claim 1, wherein:
the plurality of bonding pads are arranged in a single row.

4. A LOC type semiconductor package according to claim 3, wherein:
the single row is arranged in a generally longitudinal direction and generally centered on the semiconductor chip.

5. A LOC type semiconductor package according to claim 1, wherein:
the plurality of bonding pads are arranged in two parallel rows.

6. A LOC type semiconductor package according to claim 5, wherein:
the parallel rows are arranged in a generally longitudinal direction about a central longitudinal axis of the semiconductor chip.

7. A LOC type semiconductor package according to claim 1, wherein:
the attachment sections of the stable leads are configured to increase the bond strength between the attachment section and the adhesive composition.

8. A LOC type semiconductor package according to claim 7, wherein:
the attachment section of the stable leads includes a substantially greater width than an adjacent inner portion of the stable leads.

9. A LOC type semiconductor package according to claim 7, wherein:
the attachment sections of the stable lead have a serpentine configuration.

10. A LOC type semiconductor package according to claim 7, wherein:
the attachment sections of the stable leads are configured to form an open structure having an inside edge and an outside edge.

* * * * *